United States Patent
Bartray et al.

(10) Patent No.: US 7,061,579 B2
(45) Date of Patent: Jun. 13, 2006

(54) LITHOGRAPHIC APPARATUS AND DEVICE MANUFACTURING METHOD

(75) Inventors: Pertrus Rutgerus Bartray, Ysselsteyn (NL); Wilhelmus Josephus Box, Eksel (NL); Bernardus Antonius Johannes Luttikhuis, Nuenen (NL); Michael Ten Bhomer, Veghel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/735,847

(22) Filed: Dec. 16, 2003

(65) Prior Publication Data

US 2005/0105070 A1    May 19, 2005

(30) Foreign Application Priority Data

Nov. 13, 2003  (WO) ............... PCT/NL03/00798

(51) Int. Cl.
   *G03B 27/42*   (2006.01)
   *G03B 27/58*   (2006.01)
   *G03B 27/62*   (2006.01)

(52) U.S. Cl. ............... 355/53; 355/72; 355/75
(58) Field of Classification Search ......... 355/53, 355/67–71, 72–76; 359/811–820
   See application file for complete search history.

(56) References Cited

U.S. PATENT DOCUMENTS 5,644,137 A * 7/1997 Waggener et al. ....... 250/492.2
6,020,950 A * 2/2000 Shiraishi .................. 355/30
6,262,795 B1 * 7/2001 Baker et al. .............. 355/53
6,449,106 B1   9/2002 Spinali
6,473,245 B1  10/2002 Spinali
6,529,264 B1   3/2003 Ikeda
6,538,720 B1   3/2003 Galburt et al.
6,549,347 B1   4/2003 Spinali
6,577,457 B1   6/2003 Spinali
6,674,512 B1 * 1/2004 Novak et al. ............. 355/67
6,822,727 B1 * 11/2004 Shima .................... 355/53
2002/0154839 A1 * 10/2002 Trost ..................... 384/100
2004/0204777 A1 * 10/2004 Harpaz ................... 700/63

FOREIGN PATENT DOCUMENTS

JP       WO99/28957   *  6/1999
WO      WO 02/21207 A1   3/2002

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus is disclosed. The apparatus includes an illumination system that provides a beam of radiation, and a support structure that supports a patterning structure. The patterning structure is configured to impart the beam of radiation with a pattern in its cross-section. The apparatus also includes a substrate support that supports a substrate, a projection system that projects the patterned beam onto a target portion of the substrate, and a reference frame that provides a reference surface with respect to which a position of at least one of the substrate and the patterning structure is measured. The reference frame includes a material that has a coefficient of thermal expansion of greater than about $2.9 \times 10^{-6}$/K.

23 Claims, 4 Drawing Sheets

LITHOGRAPHIC APPARATUS AND DEVICE MANUFACTURING METHOD

CROSS-REFERENCE TO RELATED APPLICATIONS

This application is based on and claims the benefit of priority from International Patent Application No. PCT/NL03/00798 filed Nov. 13, 2003, the entire contents of which are incorporated herein by reference.

BACKGROUND OF THE INVENTION

1. Field of Invention

The present invention relates to a lithographic apparatus and a device manufacturing method.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device or structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

Lithographic apparatus comprise a reference frame, which may also be referred to as a metrology frame in the art. The reference frame provides support for the projection system. In certain types of conventional lithographic apparatus, the reference frame is isolated from disturbances caused by other components of the lithographic apparatus, such as the long and short stroke motors used to drive the reticle and wafer stages. Reference frames are conventionally made from materials having a low coefficient of thermal expansion, such as alloys including INVAR™. Until now, it has been assumed that such materials having a low coefficient of thermal expansion are required in order to meet the thermal demands of the reference frame. Unfortunately, these materials are expensive, resulting in a high manufacture cost. Furthermore, such materials are in limited supply and have a limited manufacturability. Operating in a dynamic market of supply and demand, these factors contribute to an unacceptably long lead time for the production of a reference frame. Such a long lead time also includes a large expense in terms of the man-hours required to construct the reference frame due to the sub-optimal manufacturability of conventional reference frame materials. Due to problems in supply and demand of reference frames, it has been found that it is difficult to supply reference frames in sufficiently high volume in a market upturn, thereby losing output, and it is not possible to reduce output volume in a market down-turn, thereby forcing goods to remain in storage.

U.S. Pat. No. 6,529,264 discloses a frame for connecting parts of an optical system, comprising two barrels disposed on top of their own flange-connection to an assembly frame. The patent addresses the problem that movements between certain points of the optical axis that are relatively weakly connected result in imaging performance loss. In particular, this patent addresses the problem of reducing these movements in the frame. It would appear that the frame is made of materials including aluminium and stainless steel. The frame does not constitute a reference frame, but can be seen as part of a projection optics assembly, where it provides the function of improving the imaging performance of this assembly. The frame suffers vibrations, which are transferred to the optical barrel. U.S. Pat. No. 6,529,264 addresses the problem of reducing vibrations which are transferred to the optical barrel. Further, U.S. Pat. No. 6,529,264 merely addresses the dynamical problems in optical systems that are built up from several separate sub-assemblies which much be kept dynamically stable with respect to one another. In U.S. Pat. No. 6,529,264, the required additional solution includes providing an additional frame. The provision of an additional frame produces an overdetermined construction, because a single lower assembly frame, would be sufficient. To overcome the mechanical problems of overdetermination, the solution would be to make the frame a separate part that is only stiff in limited directions and to connect it after the two barrels are positioned to each other through the assembly frame, as proposed in U.S. Pat. No. 6,529,264. Further, the thermo-dynamical problems of an overdetermined assembly would be to make the materials of the frame parts and the assembly frame part the same, also as proposed in U.S. Pat. No. 6,529,264.

BRIEF SUMMARY OF THE INVENTION

It is an aspect of the present invention to overcome the problems associated with the supply of conventional reference frame materials without encountering performance problems in return.

According to an aspect of embodiments of the invention, there is provided a lithographic apparatus comprising: an illumination system for providing a projection beam of radiation; a support structure for supporting a patterning device, the patterning device serving to impart the projection beam with a pattern in its cross-section; a substrate table for holding a substrate; a projection system for projecting the patterned beam onto a target portion of the substrate; and an isolated reference frame for providing a reference surface with respect to which a position of at least one of the substrate and the patterning device is measured, characterized in that the reference frame comprises a material having a high coefficient of thermal expansion.

By providing a reference frame comprising a material having a high coefficient of thermal expansion a wider variety of materials are available for the reference frame. It has been found that materials, such as aluminium or aluminium alloy materials, results in a significant cost reduction and a significant lead-time decrease. Further, the present invention provides the additional surprising effect that the dynamic performance of the reference frame is equal or better than reference frames made of conventional materials, such as INVAR™. By rejecting the assumption that a reference frame must be constructed of a material having a low coefficient of thermal expansion in order to achieve the required thermal and thermo-dynamic performance, the inventors have overcome substantial technical prejudice.

In a preferred embodiment, the reference frame supports a measuring system for determining the position of at least one of the substrate and the patterning device prior to its exposure.

In a preferred embodiment, the measuring system differentially determines in a direction of measurement, the position of one of at least the substrate and the patterning device to compensate for movement of the reference frame in the direction of measurement. By differentially determining the position of at least one of the substrate and the patterning device, any movement of the reference frame is compensated for.

In a preferred embodiment, the coefficient of thermal expansion is greater than approximately $2.9 \times 10^{-6}$/K.

According to an aspect of embodiments of the invention, the apparatus includes an illumination system that provides a beam of radiation, and a support structure that supports a patterning structure. The patterning structure is configured to impart the beam of radiation with a pattern in its cross-section. The apparatus also includes a substrate support that supports a substrate, a projection system that projects the patterned beam onto a target portion of the substrate, and a reference frame that provides a reference surface with respect to which a position of at least one of the substrate and the patterning structure is measured. The reference frame includes a material that has a coefficient of thermal expansion of greater than about $2.9 \times 10^{-6}$/K.

Surprisingly, it has been found that materials having a coefficient of thermal expansion greater than approximately $2.9 \times 10^{-6}$/K provide a reference frame having sufficient mechanical and thermal stability. It has been found that SiSiC, having a coefficient of thermal expansion of approximately $2.9 \times 10^{-6}$/K, is a material fulfilling these requirements.

In a preferred embodiment, the reference frame comprises any one of the materials aluminium, aluminium alloy, titanium, iron, cast-iron, steel, stainless steel, copper, a ceramic material, concrete, granite, porcelain or combinations of these materials, for example, in a composite, sandwich or laminated structure. By using such materials, the production costs of the reference frame are reduced. Further, an increase in design freedom is provided. The use of more versatile materials results in less technical production documentation with less mechanical development required for design changes in the reference frame and new frame designs. In particular, it has been found that aluminium or aluminium alloy, for example, are particularly dynamically robust.

In a preferred embodiment, the reference frame comprises a monolithic block of material. By providing a reference frame in the form of a monolithic block, the manufacturability of the reference frame is further improved, in contrast to conventional reference frames, which may comprise a large number of casting or plate parts which require welding together. Further, a monolithic block provides a low internal thermal resistance and high thermal capacity. This results in only small temperature fluctuations from dynamic heat load variations and as a result small thermal drift of the reference frame.

In a preferred embodiment, the monolithic block is machined to form the reference frame. By machining a monolithic block, time consuming and expensive welding procedures are avoided.

In a preferred embodiment, the reference frame is provided with a cooling device for controlling the temperature of the reference frame. By providing such a cooling device, the long term thermal stability of the reference frame is improved. Further, after thermal drift of the reference frame and the optical system (caused, for example, by a service, maintenance or installation, etc), the thermal stabilization to reach the required performance is significantly reduced by active cooling. Another advantage is the improved thermal conditioning of the projection system provided with an actively conditioned reference frame.

In a preferred embodiment, the reference frame is provided with a highly infrared reflective surface. By providing the reference frame with a highly infrared reflective surface, the contamination risk is reduced, and/or the infrared reflection can be increased, and/or the friction coefficient can be enlarged. In particular, the surface may be provided in the form of a coating of a metal material of, for example, nickel.

In a preferred embodiment, the reference frame is made of a material having a high specific heat and/or a high thermal conductivity. In particular, a material having a specific heat higher than about 600 J/(kg.K) and/or said thermal conductivity higher than about 20 W/(m.K).

By providing a reference frame of a material having a high specific heat and/or a high thermal conductivity, the thermal stability of the frame is improved.

According to another aspect of embodiments of the invention, a reference frame is provided. The reference frame includes a material having a coefficient of thermal expansion of greater than about $2.9 \times 10^{-6}$/K.

According to a further aspect of the invention, a device manufacturing method is provided. The method includes: providing a substrate; providing a projection beam of radiation using an illumination system; using a patterning device to impart the projection beam with a pattern in its cross-section; projecting the patterned beam of radiation onto a target portion of the substrate, and using an isolated reference frame to provide a reference surface with respect to which said substrate is measured, characterized in that said reference frame comprises a material having a high coefficient of thermal expansion.

According to yet another aspect of the invention, a device manufacturing method is provided. The method includes providing a beam of radiation; patterning the beam of radiation; projecting the patterned beam of radiation onto a target portion of a substrate; providing a reference frame that includes a reference surface; and measuring a position of the substrate with respect to the reference surface. The reference frame includes a material having a coefficient of thermal expansion of greater than about $2.9 \times 10^{-6}$/K.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, because the substrate may be processed more than once, for example, in order to create a multi-layer IC, the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams. In a particular embodiment of the present invention, the projection beam of radiation has a wavelength in the region of or shorter than 348 nm.

The term "patterning device" or "patterning structure" used herein should be broadly interpreted as referring to a device or structure that can be used to impart a projection beam with a pattern in its cross-section so as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of the patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of the patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors, such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
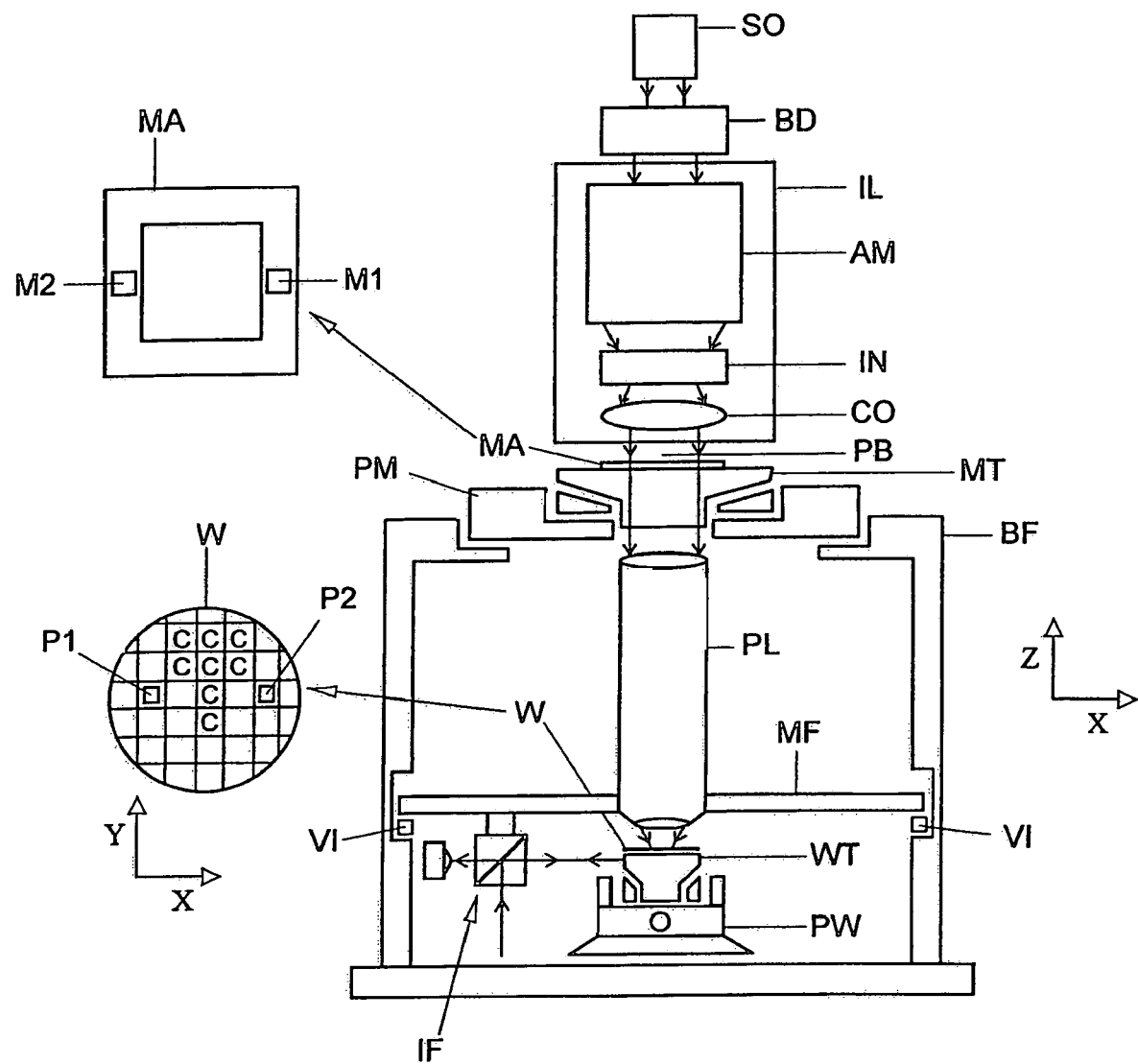
FIG. 1 depicts a lithographic apparatus according to an embodiment of the invention.

FIG. 1 schematically depicts a lithographic apparatus according to a particular embodiment of the invention. The apparatus comprises: an illumination system (illuminator) IL for providing a projection beam PB of radiation (e.g. UV radiation or EUV radiation); a first support structure (e.g. a mask table) MT for supporting a patterning structure (e.g. a mask) MA and connected to a first positioning device PM for accurately positioning the patterning structure with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a refractive projection lens) PL for imaging a pattern imparted to the projection beam PB by the patterning structure MA onto a target portion C (e.g. comprising one or more dies) of the substrate W. The term "substrate table" as used herein can also be considered or termed as a substrate support. It should be understood that the term substrate support or substrate table broadly refers to a structure that supports, holds, or carries a substrate.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example, when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Also shown in FIG. 1 are two frames: a reference frame MF, which is also known as a so-called "metrology" frame, and a base frame BF. The reference frame MF provides a reference surface with respect to which the position of at least one of the substrate WA and the patterning structure MA is measured. It is mechanically isolated from the main apparatus structure. Typically, the reference frame MF is dynamically and thermally isolated. In particular, the reference frame MF is isolated from the base frame BF shown in FIG. 1. The functions of the reference frame MF include providing high position stability of sensors and any other components mounted on the frame with respect to one another. The reference frame MF further functions as an interface frame (or carrier) of components including sensors IF, other parts and/or the projection system PL, in particular the projection lens. The reference frame MF supports sensitive components such as the position sensors, for example interferometer IF.

In particular, at least one position sensor is mounted on the reference frame to determine the position of at least one of the substrate WA and patterning means MA. As described below, the position sensors provide a differential measurement of at least one of the substrate WA and the patterning structure MA, that is movement of the reference frame in the direction of measurement is compensated for. This is achieved by providing a reference interferometer in either the projection system PL or the sensor reference system. For example, in a dual scan lithographic apparatus, an X and a Y interferometer are mounted on the reference frame MF in an expose position to measure the position of the wafer stage chuck with respect to the reference frame MF and the position of the reference frame with respect to the that part of the projection system PL in closest proximity to the wafer stage chuck. This is a differential measurement, that is, if the reference frame moves in the direction of the measurement being measured, it is compensated for. In particular, the present invention has application where a differential measurement at the expose position is carried out, since any possible drift of the metrology frame is compensated for. However, it is not necessary that a differential measurement be carried out in order for the present invention to be applied.

Additionally, depending on the particular lithographic apparatus, the reference frame may also support the projection system PL. Further, the reference frame isolates those components supported thereon from vibration. While the reference frame MF supports a metrology system, such as interferometer IF, and optionally also the projection system PL, the base frame supports other components. In particular, the base frame BF supports a vibration isolation system VI for mechanically isolating the reference frame MF from the main apparatus structure. Additionally, and optionally, the base frame may support other components, such as the wafer stage WT (not shown in FIG. 1) including the long stroke motor, and the reticle stage MT. In one embodiment, the base frame BF is in contact with the fabrication floor, alternatively, it is not. The vibration isolation system VI may be realized for example, as airmounts or other equivalent systems, such as a magnetic system, a mechanical system comprising low stiffness mechanical beams, or a fluid based system, which provide a resilient support for the reference frame MF with a low elastic coefficient. In a preferred embodiment, the vibration isolation system is disposed between the base frame BF and the reference frame RF. It is noted that the airmounts are suitable for use in a lithographic apparatus operating under a vacuum or atmospheric conditions.

The reference frame MF may be realized, for example, as a heavy table. According to the present invention, the reference frame MF is made of a material having a high coefficient of thermal expansion. Such materials may include, but are not limited to aluminium, aluminium alloy, titanium, iron, cast-iron, steel, stainless steel, copper, a ceramic material, concrete, granite, porcelain or combinations of these materials, for example, in a composite, sandwich or laminated structure. Table 1 shows some typical properties of some suitable construction materials are shown. Additionally, to aid comparison, values of the same properties are shown for INVAR™, which is a conventional material.

vides the further advantage that the dynamic performance of the reference frame MF is improved.

One suitable material is aluminium alloy of the type AA5083 (Al-4.4Mg-0.7Mn-0.15Cr). It is noted with respect to AA5083 or similar alloys, that it has the advantage that it has a very low internal stress level. This provides advantages in terms of machining a block of the material to form a reference frame MF and in terms of the long term stability of the reference frame.

TABLE 1

| Material | Coefficient of thermal expansion ($\times 10^{-6}$/K) | Specific heat (J/(kg K)) | Thermal conductivity (W/(m · K)) | Mass density (kg/m$^3$) | Modules of elasticity (N/mm$^2$) |
| --- | --- | --- | --- | --- | --- |
| INVAR ™ (conventional) | 1.5 | 500 | 13 | 8030 | 140000 |
| Aluminium alloy (eg. AA5083 O) | 24 | 900 | 120 | 2660 | 71000 |
| Steel (eg. Fe 360) | 12 | 460 | 57 | 7850 | 210000 |
| Stainless steel (eg. 304(L) or 316(L)) | 16 | 500 | 16 | 7900 | 210000 |
| Cast iron (eg. GJS400-15) | 12 | 500 | 35 | 7100 | 170000 |
| Copper | 17 | 390 | 390 | 8900 | 120000 |
| Ceramic material (eg. SiSiC) | 3 | 700 | 170 | 2950 | 410000 |
| Porcelain | 6 | 800 | 5 | 2400 | 104000 |
| Granite | 5 | 820 | 3.5 | 2650 | 30000 |

It is further noted that aluminium alloys have a coefficient of thermal expansion typically in the region of around 23 to $24.5 \times 10^{-6}$/K.

The reference frame MF is built up from a monolithic part, in other words a monolithic block. It may be cast or machined out of one block.

It has been found that a reference frame MF having a particular dimensions suitable for use in a particular lithographic apparatus made in this way from aluminium, for example, has approximately the same mass as a conventional reference frame having the same or similar dimensions. Thus, its integration into the lithographic apparatus, in particular, with respect to its interface with the vibration isolation system VI, is very easily achieved. Further, it has been found surprisingly that the temperature environment around the reference frame is stable and matches the tolerances achieved by conventional reference frame materials, such as INVAR™, which have a much lower coefficient of thermal expansion than those materials considered according to the present invention. It has been found that the dynamic performance of the reference frame made from materials which might be expected to exhibit poor dynamic performance due to their higher coefficient of thermal expansion, contrary to expectations exhibit a dynamic performance within those tolerances required in conventional lithographic apparatuses. Further, the center of gravity can readily be adapted without significant influence on the dynamical performance. In one alternative embodiment, the reference frame MF is provided which is heavier than conventional reference frames. This is achieved, for example, by increasing its dimensions and/or by selecting a material, such as iron, which has a higher density. It has been found although such a heavier reference frame requires recalibration of the vibrational isolation system VI, it pro- It will be understood that, in addition, other aluminium based alloys may also be used. With respect to the specific heat and the thermal conductivity, it has been found that the specific heat is preferably higher than about 600 J/(kg.K) and/or the thermal conductivity is preferably higher than about 20 W/(m.K).

Optionally, a cooling system may be incorporated either in or on the reference frame MF to improve the thermal stability. A fluid cooling system, such as water or air cooling, may be used to cool the reference structure. According to those embodiments, where the projection system PL is supported by the reference frame MF, the cooling system may be adapted in or on the reference frame to additionally cool the projection system. In particular, a cooling system provides long term stability and provides short recovery time after thermal drift (for example, as experience after service, maintenance, installation, etc.). The long term thermal stability is the position stability of components, for example position sensor, mounted on the reference frame over any period from for example five minutes to approximately one month, or longer.

Figure 2:
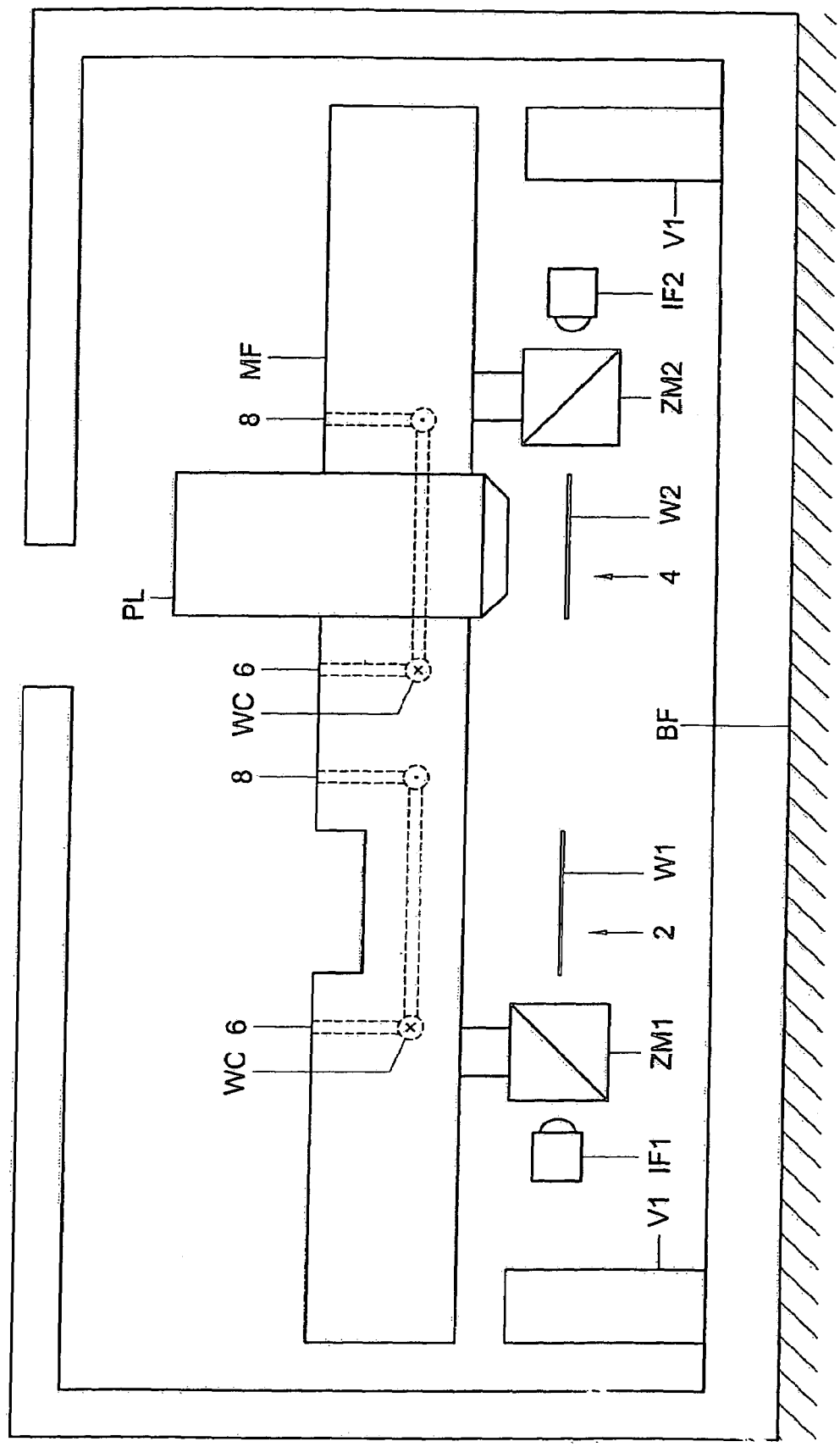
FIG. 2 depicts details of a lithographic apparatus according to a further embodiment of the invention.

FIG. 2 depicts details of a lithographic apparatus according to a further embodiment of the invention. In particular, FIG. 2 shows a reference frame MF which is suitable for use in a dual stage lithographic apparatus. A dual stage apparatus allows measurement at a measurement station 2 of one substrate W1 prior to exposure while exposure at an exposure station 4 of a different substrate 2 takes place. While the substrate W1 is in the measurement station 2, a first interferometer IF1 including a first Z-mirror ZM1 is provided to produce a "substrate map" of the substrate, that is the interferometer IF1 maps the contours of the substrates surface, so that in the exposure stage distortions in the surface of the substrate can be compensated for. While the substrate W2 is at the exposure station 4, a second interferometer IF2 including a second Z-mirror ZM2 ensures that the "substrate map" produced in the measurement stage for substrate W2 is faithfully reproduced. In this particular embodiment, the reference frame MF supports both the metrology system IF and the projection system PL. In certain lithographic apparatus, the reference frame MF may comprise a first reference frame portion on which the components providing measuring functionality are mounted and a second reference frame portion on which the components providing the exposure measuring functionality are mounted. These two frame portions are then typically mounted, for example, by bolting either to each other or to an additional mounting frame. In embodiments where the reference frame comprises more than one frame portion, each frame portion may be provided with its own vibration isolation system, respectively.

Alternatively, a single vibration isolation system may be provided. FIG. 2 further shows an example of cooling system, in particular a water cooling system WC, which is formed in the reference frame MF. As shown, the reference frame MF is provided with ducts within the frame structure into which, via inlets 6, a cooling liquid is introduced, and out of which, via outlets 8, the cooling liquid leaves the structure. The ducts are formed so as to provide circulating cooling around that portion of the reference frame MF disposed opposite the measurement station 2 and exposure station 4, respectively. The cooling system includes one or more cooling circuits. In the particular embodiment shown in FIG. 2, two cooling circuits are shown. In an alternative embodiment, cooling may be provided by one cooling circuit. The remaining components shown in FIG. 2 correspond to those shown and described with respect to FIG. 1 and are not described here further.

Figure 3:
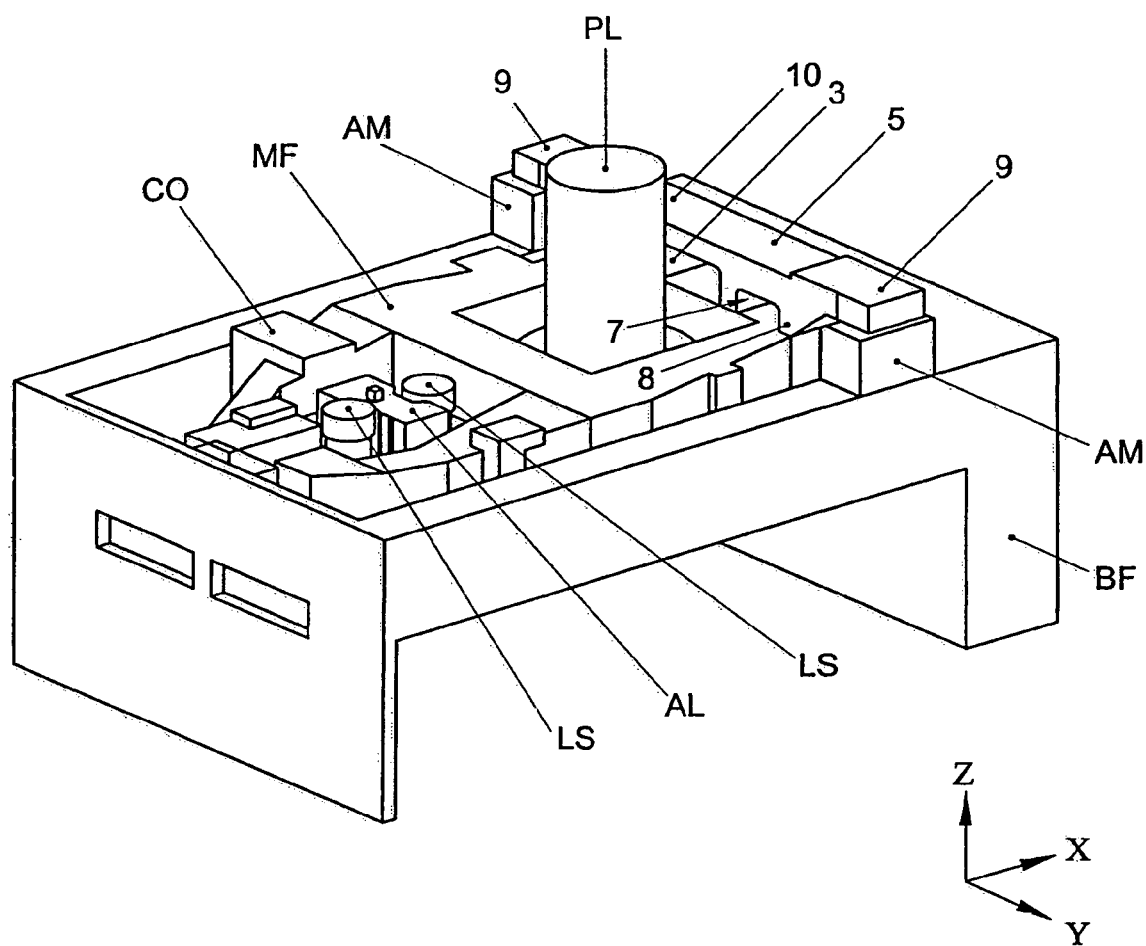
FIG. 3 depicts a top perspective view of a reference frame isolated from a base frame according to an embodiment of the present invention showing certain components supported on the reference frame.

FIG. 3 depicts a top view of a reference frame isolated from a base frame according to an embodiment of the present invention showing certain components supported on the reference frame MF. In particular, FIG. 3 shows more detail with respect to the isolated relationship between the reference frame MF and the base frame BF and shows in greater detail the reference frame MF and those components mounted thereon.

In the embodiment shown in FIG. 3, the reference frame MF comprises a first portion 3 and a second portion 5, wherein the first portion 3 and the second portion 5 are machined from first and second blocks respectively. Alternatively, they may be cast. The first and second portions 3,5 cooperate with one another to form the reference frame MF. In particular, the first portion serves to support, inter alia, those components for carrying out the measuring stage and the exposing stage, such as, for example, the projection lens PL, the level sensor module LS, which senses the level of the substrate at the measuring position, and the alignment module AL, which assesses the alignment of the substrate at the measuring position. Other components may be mounted on the underside of the reference frame MF. These are described and shown with reference to FIG. 4. In the embodiment shown in FIG. 3, the second portion 5 supports the vibration isolation system VI, which serves to isolate the reference frame MF from the base frame BF. The second portion 5 is in the form of a bridge, wherein bridge support portions 7, 8 are disposed on the first portion 3. A portion 10 extending the length of the bridge is supported by bridge support portions 7, 8. At opposite ends 9 of the extending portion 10 are vibration isolation system supporting portions 9. The airmounts AM, which form the vibration isolation system VI in FIG. 3, are disposed between portions 9 and the base frame BF. Via the bridge 5, the vibration isolation from the base frame BF afforded by the airmounts AM is transferred to the components mounted on the first portion 3. In the embodiment shown in FIG. 3, three airmounts are provided: one at either end of the bridge portion, a third (not shown in FIG. 3, but shown in FIG. 4), is disposed between the reference frame MF and the base frame BF at the opposite end in a longitudinal direction of the first portion of the reference frame MF. Embodiments of the invention are not, however, limited in this respect, and it will be understood that the vibration isolation system VI may be realized in a number of alternative ways, with respect both to the nature of the system and the number and arrangement of the system components.

In an alternative embodiment to that shown in FIG. 3, the reference frame MF is comprises of a single portion, wherein the functionalities described above with respect to the first 3 and second portion 5 are combined into a single portion.

Also shown in FIG. 3, the reference frame has a highly infrared reflective surface CO. This may be achieved by applying a coating to at least a part of the outer surface of the reference frame. The coating covers the surface of the reference frame. It may cover at least the surface of a part of the reference frame MF. The coating is of a metal material such as nickel. Alternatively, a highly infrared reflective surface may be formed by polishing or surface treating the surface of the reference frame MF.

Figure 4:
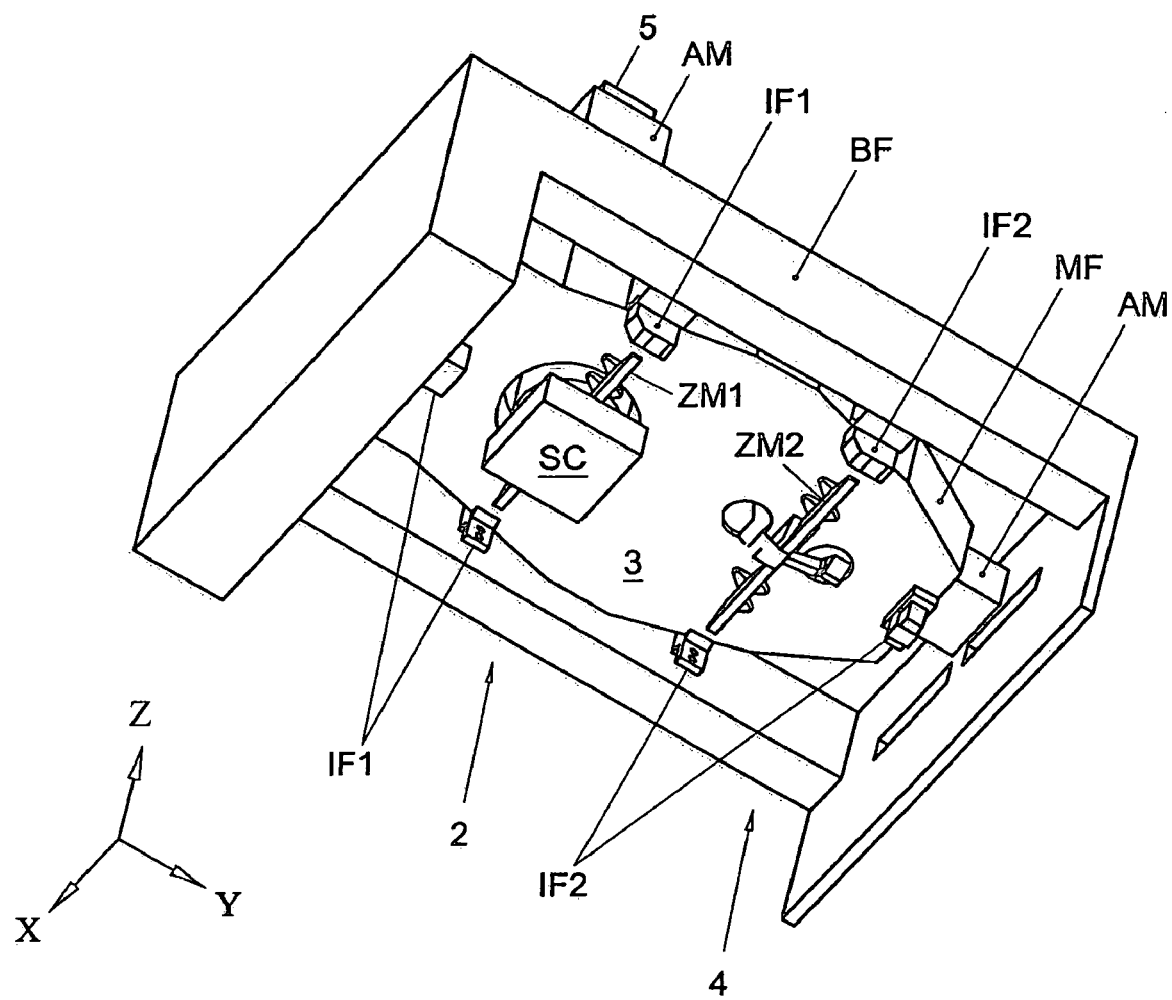
FIG. 4 depicts a bottom perspective view of the reference frame isolated from the base frame as shown in FIG. 3.

FIG. 4 depicts an underside view of the reference frame MF isolated from the base frame BF as shown in FIG. 3. In particular, those components that are mounted on the underside of the reference frame are shown. These include the interferometers IF1 arranged to carry out functions at the measuring station 2 and the interferometers IF2 arranged to carry out functions at the exposing station 4. Associated with each of these interferometers IF1, IF2 are associated Z-mirrors ZM1, ZM2, respectively. Also shown at the measuring station 2 is a substrate chuck SC which serves to support a substrate W. Once the measuring stage has been carried out, the substrate chuck SC moves from an aligned position with the measuring station 2 to an aligned position with respect to the exposing station 4. As mentioned previously, in one embodiment, two substrate chucks are provided on which respective substrates are supported. The chucks are positioned and moved with respect to one another so that a first substrate may be measured at the measuring station 2 while a second substrate is exposed at the exposing station 4. Such an arrangement increases the throughput of substrates through the lithographic apparatus.

In addition, FIG. 4 shows the vibrational isolation of the reference frame MF with respect to the base frame BF by virtue of a further airmount AM, which is provided between part of the first portion 3 of the reference frame MF and the base frame BF. Also shown, is one of the airmounts AM mounted between the second portion 5 and the base frame BF.

While specific embodiments of the invention have been described above, it will be appreciated that the invention may be practiced otherwise than as described. The description is not intended to limit the invention.

What is claimed is:

1. A lithographic apparatus comprising:
   an illumination system that provides a projection beam of radiation;
   a support structure that supports a patterning structure, the patterning structure configured to impart the projection beam with a pattern in its cross-section;
   a substrate support that supports a substrate;

a projection system that projects the patterned beam onto a target portion of the substrate;

a base frame that supports at least one of the support structure and the substrate support; and a reference frame that provides a reference surface with respect to which a position of at least one of said substrate and said patterning structure is measured, the reference frame being dynamically isolated from the base frame, wherein said reference frame comprises a material having a coefficient of thermal expansion of greater than about $2.9 \times 10^{-6}$/K.

2. A lithographic apparatus according to claim 1, wherein said reference frame supports a measuring system to determine the position of at least one of said substrate and said patterning structure prior to exposure.

3. A lithographic apparatus according to claim 2, wherein said measuring system determines the difference between the position of the reference frame with respect to the substrate table or the support structure, respectively, and the position of the reference frame with respect to the projection system or illumination system, respectively.

4. A lithographic apparatus according to claim 1, wherein the beam of radiation has a wavelength of about 348 nm.

5. A lithographic apparatus according to claim 1, wherein the beam of radiation has a wavelength of less than about 348 nm.

6. A lithographic apparatus according to claim 1, wherein said reference frame supports said projection system.

7. A lithographic apparatus according to claim 1, wherein said reference frame comprises at least one material from the group consisting of: aluminium, aluminium alloy, titanium, iron, cast-iron, steel, stainless steel, copper, a ceramic material, concrete, granite, and porcelain.

8. A lithographic apparatus according to claim 1, wherein said reference frame comprises a composite, sandwich, or laminated structure.

9. A lithographic apparatus according to claim 1, wherein said reference frame comprises a monolithic block of material.

10. A lithographic apparatus according to claim 9, wherein said monolithic block is machined to form said reference frame.

11. A lithographic apparatus according to claim 1, wherein said reference frame is connected to a cooling device to control the temperature of said projection system with respect to said reference frame.

12. A lithographic apparatus according to claim 1, wherein said reference frame comprises a highly infrared reflective surface.

13. A lithographic apparatus according to claim 12, wherein said surface is provided by a coating of a metal.

14. A lithographic apparatus according to claim 13, wherein said metal comprises nickel.

15. A lithographic apparatus according to claim 1, wherein said reference frame comprises a material having a specific heat of greater than about 600 J/(kg.K).

16. A lithographic apparatus according to claim 1, wherein said reference frame comprises a material having a thermal conductivity of greater than about 20 W/(m.K).

17. A lithographic apparatus according to claim 1, further comprising a vibration isolation system connected to said reference frame.

18. A lithographic apparatus according to claim 17, wherein said vibration isolation system comprises at least one airmount.

19. A lithographic apparatus according to claim 17, further comprising a base frame to support said vibration isolation system.

20. A reference frame for use in a lithographic apparatus, the lithographic apparatus comprising a base frame that supports at least one of a patterning structure and a substrate, the reference frame comprising a material having a coefficient of thermal expansion of greater than about $2.9 \times 10^{-6}$/K, wherein in use, the reference frame is dynamically isolated from the base frame.

21. A reference frame according to claim 20, wherein said reference frame comprises a material having a specific heat of greater than about 600 J/(kg.K).

22. A reference frame according to claim 20, wherein said reference frame comprises a material having a thermal conductivity of greater than about 20 W/(m.K).

23. A device manufacturing method comprising:

providing a beam of radiation;

patterning the beam of radiation;

projecting the patterned beam of radiation onto a target portion of a substrate, the substrate being supported by a base frame;

providing a reference frame comprising a reference surface, the reference frame comprising a material having a coefficient of thermal expansion of greater than about $2.9 \times 10^{-6}$/K, the reference frame being dynamically isolated from the base frame; and measuring a position of the substrate with respect to the reference surface.

\* \* \* \* \*